(12) United States Patent
Kudo et al.

(10) Patent No.: US 7,782,241 B2
(45) Date of Patent: Aug. 24, 2010

(54) SIGNAL PROCESSING METHOD AND DEVICE, AND ANALOG/DIGITAL CONVERTING DEVICE

(75) Inventors: Masahiro Kudo, Kawasaki (JP); Hiroshi Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/187,773

(22) Filed: Aug. 7, 2008

(65) Prior Publication Data

US 2008/0297392 A1 Dec. 4, 2008

Related U.S. Application Data

(63) Continuation of application No. PCT/JP2006/302861, filed on Feb. 17, 2006.

(51) Int. Cl.
*H03M 1/60* (2006.01)
(52) U.S. Cl. .......................... 341/157; 341/155
(58) Field of Classification Search .................. 341/155, 341/157, 166; 375/238, 239
See application file for complete search history.

(56) References Cited

U.S. PATENT DOCUMENTS

| | | | |
|---|---|---|---|
| 4,606,132 A * | 8/1986 | Briney et al. ............. | 33/366.14 |
| 5,128,624 A | 7/1992 | Hoshino et al. | |
| 5,289,135 A | 2/1994 | Hoshino et al. | |
| 5,568,071 A | 10/1996 | Hoshino et al. | |
| 6,614,217 B2 * | 9/2003 | Oohashi ..................... | 324/107 |
| 6,757,349 B1 * | 6/2004 | Katayama et al. ............ | 375/376 |
| 6,859,027 B2 * | 2/2005 | Li et al. .................... | 324/76.53 |
| 7,466,174 B2 * | 12/2008 | Tirumalai et al. ........... | 327/156 |
| 7,532,141 B2 * | 5/2009 | Kitahira et al. ............. | 341/152 |
| 2006/0087346 A1 * | 4/2006 | Ishida et al. .................... | 327/3 |
| 2006/0171495 A1 * | 8/2006 | Youssouflan ................. | 375/376 |

FOREIGN PATENT DOCUMENTS

| | | |
|---|---|---|
| EP | 0439178 A1 | 7/1991 |
| EP | 0650256 A2 | 4/1995 |
| JP | 03-220814 | 9/1991 |
| JP | 05-167450 | 7/1993 |
| WO | WO 88/01808 | 3/1988 |

* cited by examiner

*Primary Examiner*—Peguy JeanPierre
(74) *Attorney, Agent, or Firm*—Arent Fox LLP

(57) ABSTRACT

The first and second time-domain signals are received, and a difference between the pulse width of the first time-domain signal and the pulse width of the second time-domain signal within a unit time for carrying one item of analog signal information is obtained. The obtained difference is treated as positive information if the pulse width of the first time-domain signal is greater than the pulse width of the second time-domain signal, or as negative information if the pulse width of the first time-domain signal is smaller than the pulse width of the second time-domain signal.

3 Claims, 9 Drawing Sheets

US 7,782,241 B2

SIGNAL PROCESSING METHOD AND DEVICE, AND ANALOG/DIGITAL CONVERTING DEVICE

This application is a continuing application, filed under 35 U.S.C. §111(a), of International Application PCT/JP2006/302861, filed Feb. 17, 2006.

BACKGROUND

1. Field

The embodiment relates to signal processing methods and devices and analog/digital converting devices. More particularly, the embodiment relates to signal processing method and device for processing a time-domain signal, and an analog/digital converting device for converting a time-domain signal to a digital value.

2. Description of the Related Art

Techniques such as Pulse Width Modulation (PWM) have conventionally been known whereby analog signal information is represented along the time axis of a time-domain signal such as a pulse.

Where the time axis of a time-domain signal is used to represent analog signal information, the analog signal can be processed at low voltage, compared with the case where the voltage axis is used to represent analog signal information. This kind of technique has been attracting attention as a result of the recent development of higher-speed hardware enabling improved time resolution.

As such techniques of representing analog signal information along the time axis, a method has been known wherein, for example, the pulse width or pulse interval of a time-domain signal such as a pulse signal is used to represent analog signal information.

FIG. 6 illustrates an exemplary case where the pulse width carries analog signal information.

In the illustrated example, numerical values from "0" to "8" are expressed within a unit time (full-scale time) TF that carries one item of analog signal information. In this case, if the pulse width of an input pulse signal contains, for example, five time resolutions ΔT of a signal processing circuit as shown in the figure, then the input pulse signal represents "5".

An AD (Analog/Digital) converting device has been known as one of such signal processing circuits that utilize the pulse width of a time-domain signal as indicative of analog signal information.

FIG. 7 is a circuit diagram exemplifying a conventional AD converting device.

The AD converting device 50 includes flip-flop circuits (hereinafter abbreviated as FFs) 51 to 55, buffers 60 to 63, an inverter 70, and an encoder 71.

The FFs 51 to 55 each comprise a D flip-flop, for example, and the buffers 60 to 63 are each constituted by a two-stage inverter.

The FF 51 is input at all times with "1" at its terminal D and is also input with a time-domain signal at its terminal C. When the time-domain signal changes from "0" to "1", "1" is captured from the terminal D, held by the FF 51, and also output from the output terminal Q. A reset signal is input to the terminal R, and when the reset signal turns to "1", the output at the terminal Q of the FF 51 is reset to "0".

The output signal from the output terminal Q of the FF 51 is input to the buffer 60. The state of a node n10 on the input side of the buffer 60 is transmitted to a node n11 after a delay corresponding to the delay time of the buffer 60, transmitted to a node n12 after a delay corresponding to the delay times of the buffers 60 and 61, transmitted to a node n13 after a delay corresponding to the delay times of the buffers 60 to 62, and transmitted to a node n14 after a delay corresponding to the delay times of the buffers 60 to 63. The delay time provided by each of the buffers 60 to 63 determines the time resolution of the AD converting device 50.

The terminals C of the FFs 52 to 55 are input with the inverted time-domain signal through the inverter 70. Also, the terminals D of the FFs 52 to 55 are connected to the nodes n11 to n14, respectively.

Thus, at the time the time-domain signal falls, the states of the nodes n11 to n14 are captured and held by the respective FFs 52 to 55.

The reset signal is also input to the terminals R of the FFs 52 to 55. When the reset signal turns to "1", the FFs 52 to 55 are all reset to "0".

Output signals P10 to P13 from the output terminals Q of the respective FFs 52 to 55 are input to the encoder 71. In synchronism with the rise of a clock signal, for example, the encoder 71 captures the output signals P10 to P13 of the FFs 52 to 55.

In FIG. 7, the four buffers 60 to 63 and the FFs 52 to 55 for storing the states of the respective nodes n11 to n14 are illustrated for simplicity of illustration; in practice, the number of the buffers and of the FFs may be increased as desired.

Operation of the AD converting device 50 will be now described.

FIG. 8 is a timing chart exemplifying the operation of the conventional AD converting device.

The figure shows the states of individual signals in the above AD converting device 50, wherein N10 to N14 indicate signals appearing at the respective nodes n10 to n14 shown in FIG. 7. Also, TF indicates the full-scale time, and the pulse width of the time-domain signal within this full-scale time represents analog signal information. TD indicates the time necessary for the signal processing by the encoder 71 and the resetting of the FFs 51 to 55.

When the reset signal is at "1", the FFs 51 to 55 are all reset, so that the signals N10 to N14 and the output signals P10 to P13 all remain at "0". The reset signal turns to "0" thereafter, and when the time-domain signal turns to "1", the signal N10 at the node n10 changes to "1" synchronously with the rise of the time-domain signal (timing T20).

The change of the signal state is propagated to the nodes n11 to n14 while being successively delayed for the delay time of the buffers 60 to 63, and as a consequence, the signals N11 to N14 change to "1" in order. The states of the nodes n11 to n14 are captured by the respective FFs 52 to 55 and are output as the output signals P10 to P13 in synchronism with the fall to "0" of the time-domain signal. By counting at this time the number of output signals whose state is "1", among the output signals P10 to P13, it is possible to specify, as a discrete value, up to which of the buffers 60 to 63 the state "1" has propagated during the period from the rise to the fall of the time-domain signal. Thus, the pulse width of the time-domain signal is digitized using the delay time of each buffer as a unit. With the circuit exemplified in FIG. 7, numerical values from "0" to "4" can be expressed by means of the output signals P10 to P13.

The time-domain signal turns to "0" at timing T21 within the first full-scale time TF. By this time, the signals N11 to N13 have changed to "1", but the signal N14 still remains at "0" because of the delay time. In this case, therefore, the three output signals P10 to P12 turn to "1" while the output signal P13 remains at "0". Accordingly, the pulse width of the time-domain signal represents the digital value "3".

After a lapse of the full-scale time TF for the first pulse of the time-domain signal (timing T22), the encoder 71 captures the output signals P10 to P13 in synchronism with the rise of the clock signal and renders the captured data in a desired format, for example, in binary code (timing T23). When the reset signal turns to "1" (timing T24) during the time TD, the FFs 51 to 55 are all reset, so that the signal N10 and the output signals P10 to P13 all turn to "0". The reset signal again turns to "0" thereafter, and when the time-domain signal changes to "1", signal processing of the next full-scale time TF starts (timing T25). In the second full-scale time TF, the time-domain signal changes to "0" at timing T26. At this time, the signals N11 and N14 are in the state "1" and the signals N12 and N13 are in the state "0". Accordingly, the output signals P10 and P13 turn to "1" while the output signals P11 and P12 remain at "0". After a lapse of the full-scale time TF for the second pulse of the time-domain signal (timing T27), the output signals P10 to P13 are captured by the encoder 71 (timing T28). The signal P13 turns to "1" because the signal N14, which changed to "1" during the first full-scale time TF, remains in the same state and the resetting at timing T24 is not propagated yet at timing T26, and not because the rise to "1" of the time-domain signal has been propagated. To enable proper signal processing in such a situation, the encoder 71 may be provided with a mechanism whereby the output signals P10 to P13 are checked in this order to determine whether any signal assumes the state "0" indicating that the resetting has already been propagated at timing T26, and if the state "0" is detected, the values of the succeeding output signals are all corrected to "0". In the above instance, the output signal P11 is "0", and accordingly, the encoder 71 corrects the output signals P12 and P13 to "0", whereby the digital value "1" is derived as the pulse width of the time-domain signal.

In cases where analog signal information is represented along the time axis of a time-domain signal as in the conventional method, the S/N ratio is proportional to the full-scale time and is inversely proportional to the time resolution. If the full-scale time is prolonged, however, the signal processing speed lowers, and thus the full-scale time should not be substantially prolonged. Also, the time resolution has a limit determined by the operating speed and power consumption of devices such as transistors, giving rise to a problem that the time resolution cannot be set finely as desired.

Further, where a time-domain signal generated by a signal generating circuit is processed by a signal processing circuit such as the AD converting device shown in FIG. 7, for example, a problem also arises in that a pulse width difference occurs due to a difference between the threshold used at the signal generating side to discriminate between "1" and "0", and the threshold used at the signal processing side.

FIG. 9 illustrates such a pulse width difference attributable to a difference between the thresholds.

If the threshold used at the signal generating side to discriminate between "1" and "0" differs from that used at the signal processing side, a difference (offset) occurs between a pulse width tw10 detected at the signal generating side and a pulse width tw11 detected at the signal processing side, as shown in the figure, for example. The offset is a cause of lowering in the signal processing accuracy.

Also, it is occasionally the case that a pulse width offset occurs due to a difference (skew) between the time periods needed to process the rising and falling edges, respectively, of the time-domain signal in the signal processing circuit.

In the conventional AD converting device, for example, the rise of the time-domain signal and the rise of the signal N10 should ideally take place at the same timing, and also the fall of the time-domain signal and the change of the output signals P10 to P13 should ideally take place at the same timing, as shown in the timing chart of FIG. 8. In practice, however, delay exists between the rise of the time-domain signal and the actual output of "1" from the FF 51 and also between the fall of the time-domain signal applied to the FFs 52 to 55 through the inverter 70 and the capture of the states of the nodes n11 to n14 by the respective FFs, and these delays are not exactly equal in length. A problem therefore arises in that the pulse width of the time-domain signal is digitized inclusive of the pulse width difference caused by the delay.

SUMMARY

According to an aspect of the embodiments, a signal processing method of processing a time-domain signal has receiving first and second time-domain signals, obtaining a difference between first and second pulse widths of the first and second time-domain signals, respectively, within a unit time for carrying one item of analog signal information, and treating the obtained difference as positive information if the first pulse width is greater than the second pulse width, or as negative information if the first pulse width is smaller than the second pulse width.

PREFERRED EMBODIMENT

Figure 1:
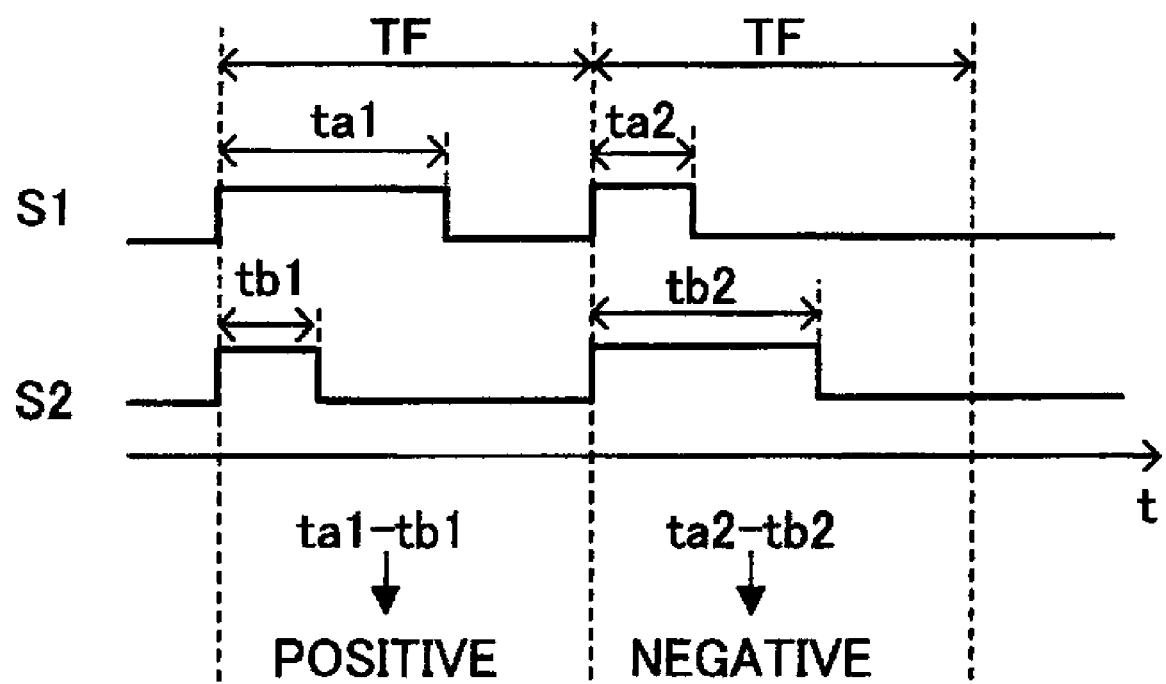
FIG. 1 is a diagram (diagram 1) illustrating a signal processing method according to an embodiment.

The embodiments provide a signal processing method for processing a time-domain signal. The signal processing method comprises the step of receiving time-domain signals S1 and S2, as shown in FIG. 1, the step of obtaining a difference between the pulse width ta1, ta2 of the time-domain signal S1 and the pulse width tb1, tb2 of the time-domain signal S2 within a unit time (full-scale time TF) for carrying one item of analog signal information, and the step of treating the obtained difference as positive information if the pulse width ta1, ta2 is greater than the pulse width tb1, tb2, or as negative information if the pulse width ta1, ta2 is smaller than the pulse width tb1, tb2.

With the above method, the information contained in the full-scale time TF is represented by the difference between the pulse width ta1, ta2 of the time-domain signal S1 and the pulse width tb1, tb2 of the time-domain signal S2, and accordingly, the individual offset components of the time-domain signals S1 and S2 are canceled out. Also, the obtained difference is handled distinctively as positive or negative information, and thus information −TF through information +TF can be contained in one full-scale time TF.

There is also provided a signal processing device for processing a time-domain signal, wherein the signal processing device is input with first and second time-domain signals, obtains a difference between first and second pulse widths of the first and second time-domain signals, respectively, within a unit time for carrying one item of analog signal information, and treats the obtained difference as positive information if the first pulse width is greater than the second pulse width, or as negative information if the first pulse width is smaller than the second pulse width.

With this configuration, the difference between the first and second pulse widths of the first and second time-domain signals represents information contained in the unit time, and therefore, the individual offset components of the first and second time-domain signals are canceled out. Also, the pulse width difference is treated distinctively as positive or negative information, and thus, twice as much information can be carried per unit time.

There is also provided an analog/digital converting device for converting a time-domain signal to a digital value. The analog/digital converting device comprises a digital converter for receiving first and second time-domain signals, converting a first pulse width of the first time-domain signal within a unit time for carrying one item of analog signal information, into a first digital value, and converting a second pulse width of the second time-domain signal within the unit time into a second digital value, and a subtracter for subtracting the second digital value from the first digital value and treating a result of the subtraction as a digital value contained in the unit time.

With the above configuration, the digital converter receives the first and second time-domain signals, converts the first pulse width of the first time-domain signal within a unit time for carrying one item of analog signal information, into a first digital value, and converts the second pulse width of the second time-domain signal within the unit time into a second digital value. The subtracter subtracts the second digital value from the first digital value and treats the result of the subtraction as a digital value contained in the unit time.

Embodiments will be described in detail below with reference to the accompanying drawings, wherein like reference numerals refer to like elements throughout.

Figure 2:
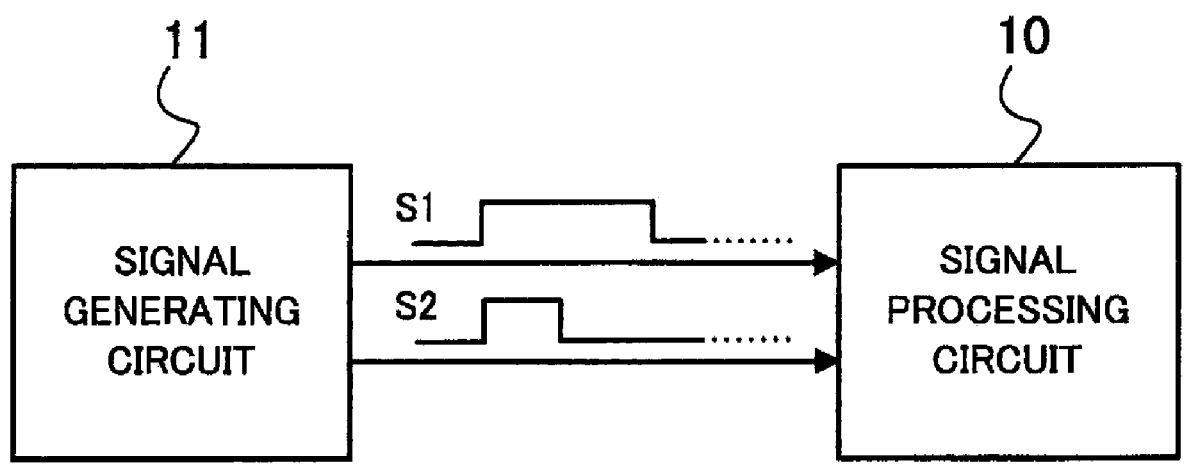
FIG. 2 is a diagram (diagram 2) also illustrating the signal processing method of the embodiment.

FIGS. 1 and 2 illustrate a signal processing method according to an embodiment.

As shown in FIG. 2, a signal processing circuit 10 used in this embodiment receives two time-domain signals S1 and S2 from a signal generating circuit 11. The time-domain signals S1 and S2 are pulse signals, as shown in FIG. 1.

When input with the time-domain signals S1 and S2 shown in FIG. 1, the signal processing circuit 10 obtains a difference between pulse widths ta1 and tb1 of the two time-domain signals S1 and S2 during the first full-scale time TF.

Specifically, the pulse width difference is obtained as follows. The time-domain signals S1 and S2 received from the signal generating circuit 11 have their rise timings aligned with each other, as shown in FIG. 1, and the pulse width difference is obtained from a difference between the fall timings of the two signals. The fall timings of the time-domain signals S1 and S2 may be aligned instead, and the pulse width difference may be obtained from a difference between the rise timings of the two signals. Alternatively, the pulse width difference may be obtained using both the rise and fall timings of the signals.

Also, if the pulse width ta1 of the time-domain signal S1 is greater than the pulse width tb1 of the time-domain signal S2, the signal processing circuit 10 treats the obtained difference as positive information, and if the pulse width ta1 of the time-domain signal S1 is smaller than the pulse width tb1 of the time-domain signal S2, the signal processing circuit 10 treats the obtained difference as negative information. In the first full-scale time TF shown in FIG. 1, for example, the pulse width ta1 of the time-domain signal S1 is greater (longer in time) than the pulse width tb1 of the time-domain signal S2, and accordingly, the obtained difference ta1−tb1 is handled as positive information.

In the next full-scale time TF, on the other hand, the pulse width ta2 of the time-domain signal S1 is smaller (shorter in time) than the pulse width tb2 of the time-domain signal S2, and therefore, the obtained difference ta2−tb2 is treated as negative information.

Then, the signal processing circuit 10 performs signal processing by using the positive or negative difference information as information of the corresponding full-scale time TF.

With the signal processing method, information −TF through information +TF can be represented in a single full-scale time TF. Namely, twice as much information can be carried per full-scale time TF. Thus, compared with the conventional case where the time-domain signal is used in the manner shown in FIG. 6, the signal processing speed can be doubled without degrading the S/N ratio. In addition, the advantageous effects mentioned below can be obtained.

Figure 3:
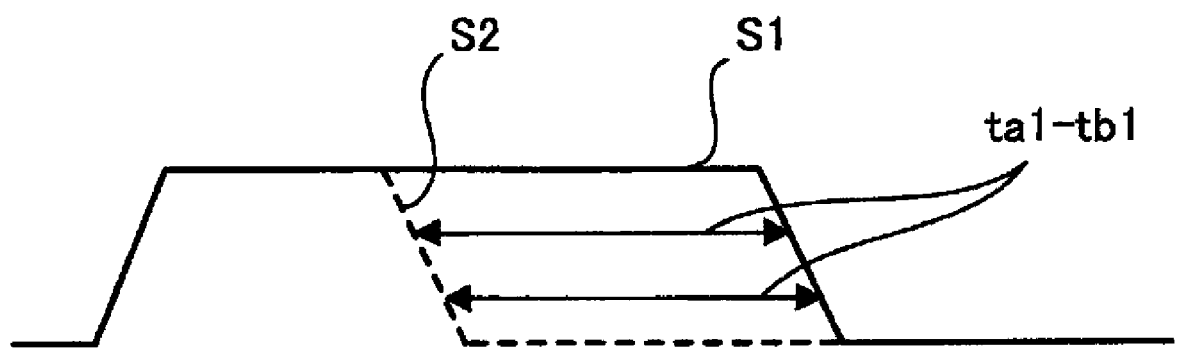
FIG. 3 shows pulses of two time-domain signals.

FIG. 3 shows pulses of the two time-domain signals.

In the figure, the pulses of the two time-domain signals S1 and S2 in the first full-scale time TF in FIG. 1 are shown enlarged. As stated above, the signal processing method of this embodiment uses the difference ta1−tb1 between the two time-domain signals S1 and S2, and not the pulse widths, as information of one full-scale time TF to be handled by the signal processing circuit 10. Thus, even if the threshold used in the signal generating circuit 11 to discriminate between "1" and "0" differs from that used in the signal processing circuit 10, the difference ta1−tb1 remains unchanged. Namely, the pulse width offset component is canceled out and causes no error.

Also, the pulse width offset component arising out of the skew in the signal processing circuit 10 is canceled out by using the difference between the pulse widths of the two time-domain signals S1 and S2.

Further, external noise attributable, for example, to power supply fluctuation in the signal generating circuit 11 can also be canceled out by using the pulse width difference, since such noise is applied to both of the two time-domain signals S1 and S2.

As seen from the above, with the signal processing method according to the embodiment, analog signal information represented along the time axis of the time-domain signals can be processed with high accuracy and at high speed.

An AD converting device for converting the time-domain signals to digital values will be now described as an example of the signal processing circuit 10.

Figure 4:
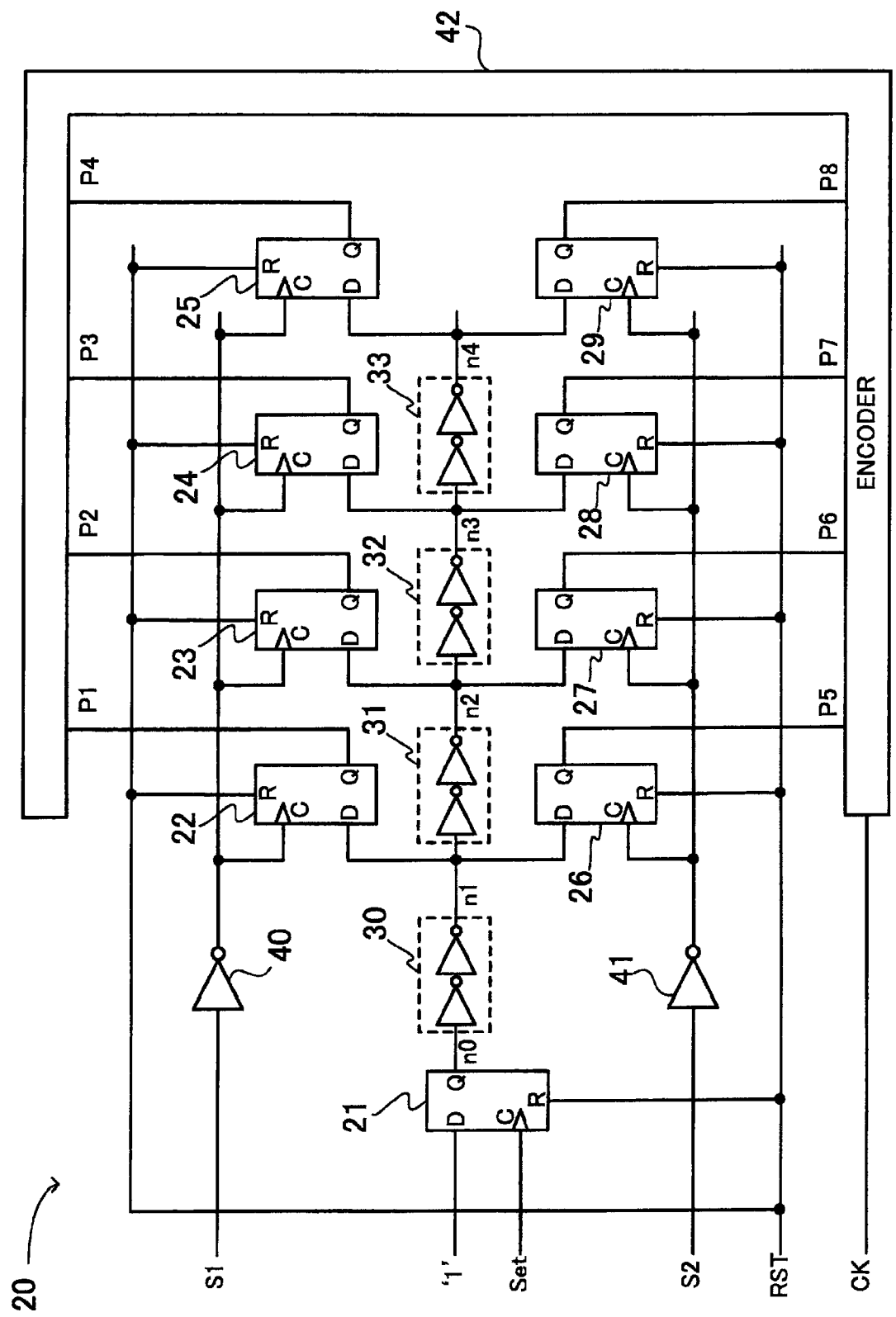
FIG. 4 is a circuit diagram exemplifying an AD converting device according to an embodiment.

FIG. 4 is a circuit diagram exemplifying an AD converting device according to an embodiment.

The AD converting device 20 includes FFs 21 to 29, buffers 30 to 33, inverters 40 and 41, and an encoder 42.

The FFs 21 to 29 each comprise a D flip-flop, for example, and each of the buffers 30 to 33 is constituted by a two-stage inverter.

The FF 21 has the function of capturing the pulse start timing of the time-domain signals S1 and S2 in the full-scale time TF. The FF 21 has a terminal D input with "1" at all times, and a terminal C input with a signal Set. The signal Set is, for example, a signal that turns to "1" synchronously with the rise timing of both time-domain signals S1 and S2. When the signal Set changes from "0" to "1", "1" applied to the terminal D is captured, held by the FF 21, and also output from the output terminal Q. The signal Set may rise at timing slightly before or after the rise timing of both time-domain signals S1 and S2, or the OR of the time-domain signals S1 and S2 may be used as the signal Set. A reset signal RST is input to the terminal R of the FF 21. The signal Set, reset signal RST and clock signal CK are supplied, for example, from the signal generating circuit 11 shown in FIG. 2 or from a timing control circuit for externally controlling the timing of the signal generating circuit 11 and the signal processing circuit 10 in FIG. 2.

The output signal from the output terminal Q of the FF 21 is input to the buffer 30. The state of a node n0 on the input side of the buffer 30 is transferred to a node n1 after a delay corresponding to the delay time of the buffer 30, transferred to a node n2 after a delay corresponding to the delay times of the buffers 30 and 31, transferred to a node n3 after a delay corresponding to the delay times of the buffers 30 to 32, and transferred to a node n4 after a delay corresponding to the delay times of the buffers 30 to 33. Thus, the series-connected buffers 30 to 33 function as a delay circuit, and the delay time provided by each buffer determines the time resolution of the AD converting device 20.

The FFs 22 to 25 are input, at their terminals C, with the inverted time-domain signal S1 via the inverter 40, and the FFs 26 to 29 are input, at their terminals C, with the inverted time-domain signal S2 via the inverter 41. Also, the FFs 22 and 26 have their terminals D connected to the node n1, the FFs 23 and 27 have their terminals D connected to the node n2, the FFs 24 and 28 have their terminals D connected to the node n3, and the FFs 25 and 29 have their terminals D connected to the node n4.

Accordingly, the states of the nodes n1 to n4 are captured and held by the respective FFs 22 to 25 synchronously with the fall timing of the time-domain signal S1, and also the states of the nodes n1 to n4 are captured and held by the respective FFs 26 to 29 synchronously with the fall timing of the time-domain signal S2.

The reset signal RST is also input to the terminals R of the FFs 22 to 29. When the reset signal RST turns to "1", the FFs 22 to 29 are all reset to "0".

Output signals P1 to P8 from the output terminals Q of the respective FFs 22 to 29 are input to the encoder 42. In synchronism with the rise of the clock signal CK, for example, the encoder 42 captures the output signals P1 to P8 of the FFs 22 to 29.

In FIG. 4, the four buffers 30 to 33 and the FFs 22 to 29 for storing the states of the nodes n1 to n4 are illustrated for simplicity of illustration; in practice, the number of the buffers and of the FFs may be increased as desired.

Operation of the AD converting device 20 will be now described.

Figure 5:
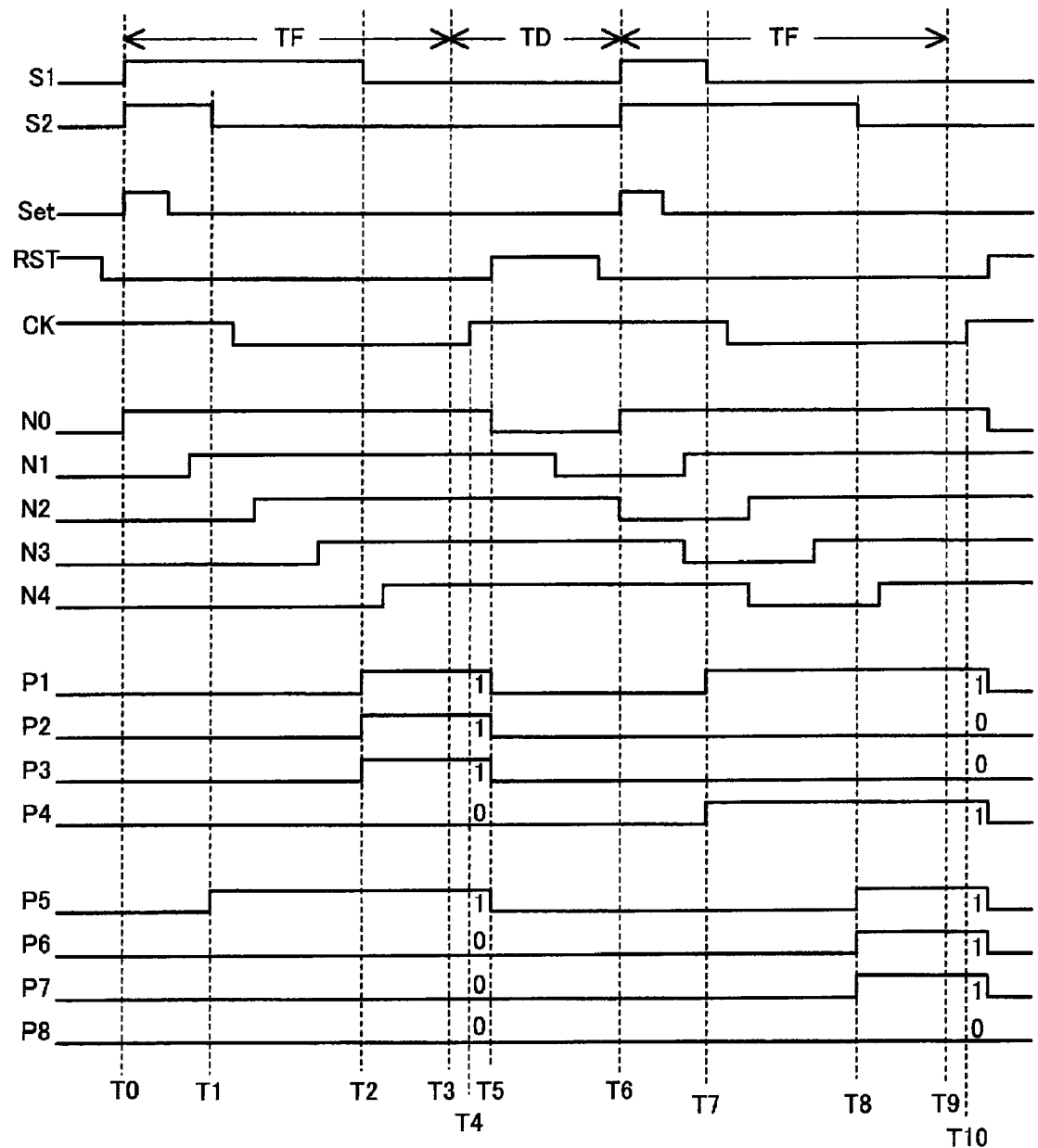
FIG. 5 is a timing chart exemplifying the operation of the AD converting device of the embodiment.

FIG. 5 is a timing chart exemplifying the operation of the AD converting device of the embodiment.

The figure shows the states of individual signals in the above AD converting device 20, wherein N0 to N4 indicate signals appearing at the respective nodes n0 to n4 shown in FIG. 4. Also, TF indicates the full-scale time, and the pulse width difference between the time-domain signals S1 and S2 within the full-scale time represents analog signal information. TD indicates the time necessary for the signal processing by the encoder 42 and the resetting of the FFs 21 to 29.

At first, the reset signal RST is at "1", and thus the FFs 21 to 29 are all reset, so that the signals N0 to N4 and the output signals P1 to P8 are all "0". The reset signal RST turns to "0" thereafter, and when the time-domain signals S1 and S2 turn to "1", the signal Set changes to "1". In synchronism with the rise of the signal Set, the signal N0 at the node n0 changes to "1" (timing T0). This change of the signal state is propagated to the nodes n1 to n4 while being successively delayed for the delay time of the buffers 30 to 33, and as a consequence, the signals N1 to N4 change to "1" in order. The states of the nodes n1 to n4 are captured by the FFs 22 to 25 and the FFs 26 to 29 and output as the output signals P1 to P8 in synchronism with the falls to "0" of the respective time-domain signals S1 and S2. By counting at this time the number of signals whose state is "1", among the output signals P1 to P4, it is possible to specify, as a discrete value, up to which of the buffers 30 to 33 the state "1" has been propagated during the period from the rise to the fall of the time-domain signal S1. Likewise, by counting the number of signals whose state is "1", among the output signals P5 to P8, it is possible to specify, as a discrete value, up to which of the buffers 30 to 33 the state "1" has been propagated during the period from the rise to the fall of the time-domain signal S2. Consequently, the pulse widths of the time-domain signals S1 and S2 are digitized using the delay time of each buffer as a unit. With the circuit exemplified in FIG. 4, numerical values from "0" to "4" can be expressed by each set of the output signals P1 to P4 and the output signals P5 to P8.

In the example shown in FIG. 5, the time-domain signal S2 turns to "0" at timing T1 within the first full-scale time TF. By this time, the signal N1 has changed to "1", but the signals N2 to N4 still remain at "0" because of the delay time. In this case, therefore, the output signal P5 turns to "1" while the output signals P6 to P8 remain at "0". As a result, the pulse width of the time-domain signal S2 is converted to the digital value "1".

On the other hand, the time-domain signal S1 turns to "0" at timing T2. By this time, the signals N1 to N3 have changed to "1", but the signal N4 still remains at "0" because of the delay time. In this case, therefore, the output signals P1 to P3 turn to "1" while the output signal P4 remains at "0". Thus, the pulse width of the time-domain signal S1 represents the digital value "3".

After a lapse of the full-scale time TF for the first pulses of the time-domain signals S1 and S2 (timing T3), the encoder 42 captures the output signals P1 to P8 in synchronism with the rise of the clock signal CK. Then, the encoder 42 subtracts the digital value "1", which is the pulse width of the time-domain signal S2 represented by the output signals P5 to P8, from the digital value "3", which is the pulse width of the time-domain signal S1 represented by the output signals P1 to P4, and obtains the digital value "2". The result of the subtraction may be rendered in a desired format, for example, in binary code by the encoder 42 (timing T4). When the reset signal RST turns to "1" (timing T5) during the time TD, the FFs 21 to 29 are all reset, so that the signal N0 and the output signals P1 to P8 all turn to "0". The reset signal RST again turns to "0" thereafter, and when the time-domain signals S1 and S2 change to "1", the signal Set rises and signal processing of the next full-scale time TF starts (timing T6).

In the second full-scale time TF, the time-domain signal S1 changes to "0" at timing T7. At this time, the signals N1 and N4 are in the state "1" and the signals N2 and N3 are in the state "0". Accordingly, the output signals P1 and P4 turn to "1" while the output signals P2 and P3 remain at "0".

On the other hand, the time-domain signal S2 changes to "0" at timing T8. At this time, the signals N1 to N3 are in the state "1" and the signal N4 is in the state "0". Thus, the output signals P5 to P7 turn to "1" while the output signal P8 remains at "0".

After a lapse of the second full-scale time TF (timing T9), the encoder 42 captures the output signals P1 to P8 in synchronism with the clock signal CK. The output signals P1 to P4 captured at this time show "1001". The output signal P4 assumes the state "1" because the signal N4, which changed to "1" during the first full-scale time TF, remains in the same state and the resetting at timing T5 is not propagated yet at timing T7, and not because the rise to "1" of the time-domain signals S1 and S2 has been propagated. To process the signals properly in such a situation, the encoder 42 may be provided with a mechanism whereby the output signals P1 to P4 and the output signals P5 to P8 are checked in this order to determine whether any signal assumes the state "0" indicating that the resetting has already been transmitted at timings T7 and T8, respectively, and if the state "0" is detected, the values of the succeeding output signals are all corrected to "0". In the above instance, the output signal P2 is "0", and accordingly, the encoder 42 corrects the output signals P3 and P4 to "0", whereby the digital value "1" is derived as the pulse width of the time-domain signal S1.

The encoder 42 then subtracts the digital value "3", which is the pulse width of the time-domain signal S2 represented by the output signals P5 to P8, from the digital value "1", which is the pulse width of the time-domain signal S1, and obtains the digital value "−2". The result of the subtraction may be rendered in a desired format, for example, in binary code by the encoder 42 (timing T10).

Figure 6:
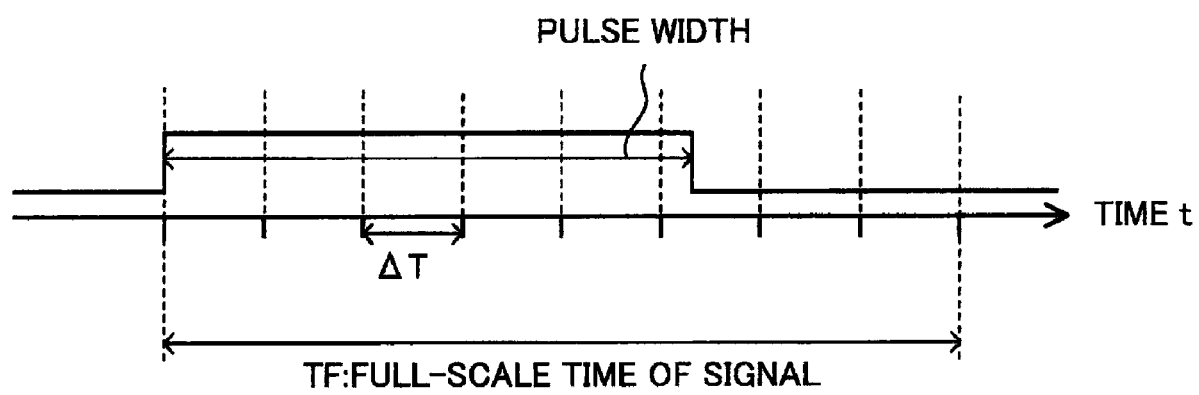
FIG. 6 illustrates an exemplary case where a pulse width represents analog signal information.
Figure 7:
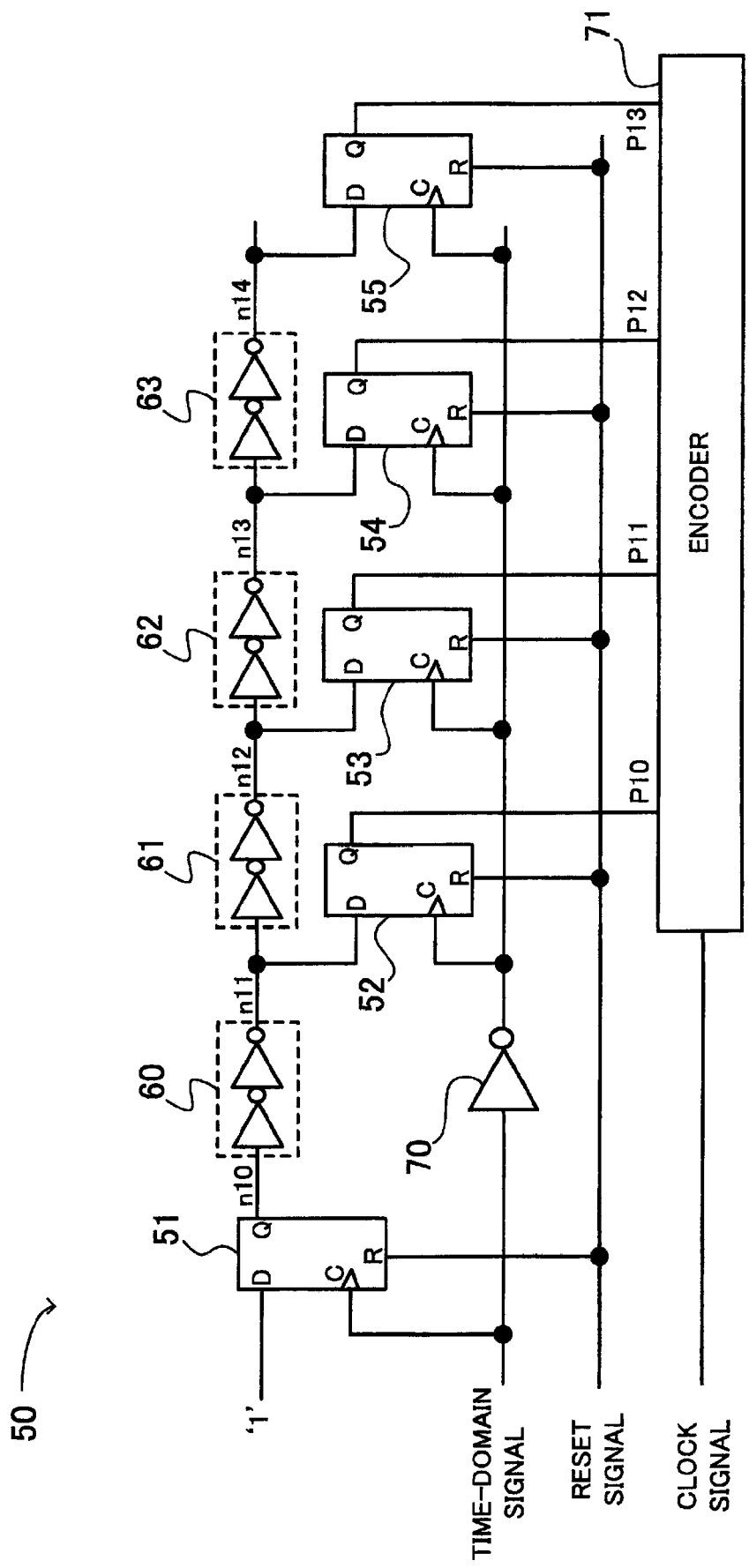
FIG. 7 is a circuit diagram exemplifying a conventional AD converting device.
Figure 8:
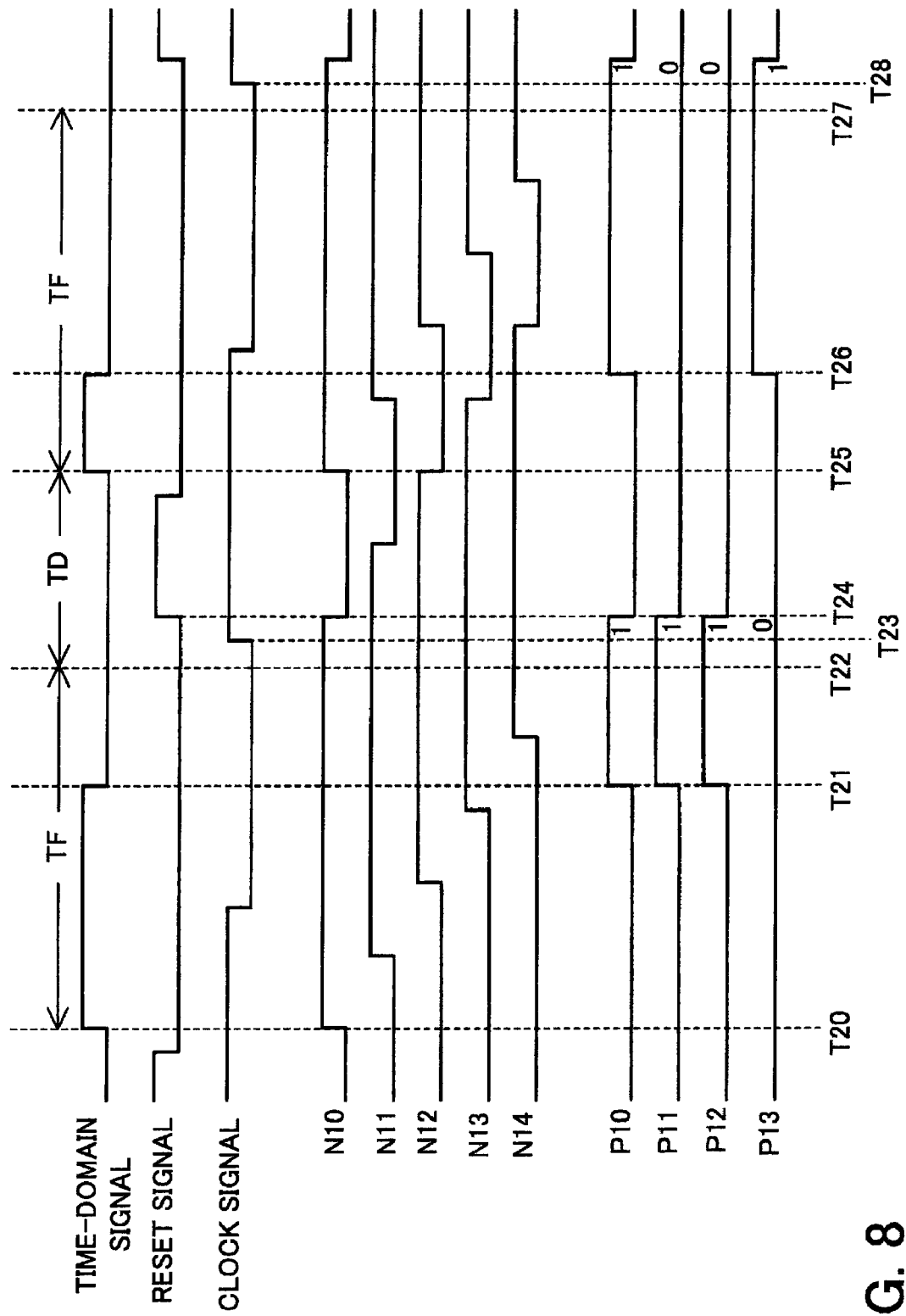
FIG. 8 is a timing chart exemplifying the operation of the conventional AD converting device.
Figure 9:
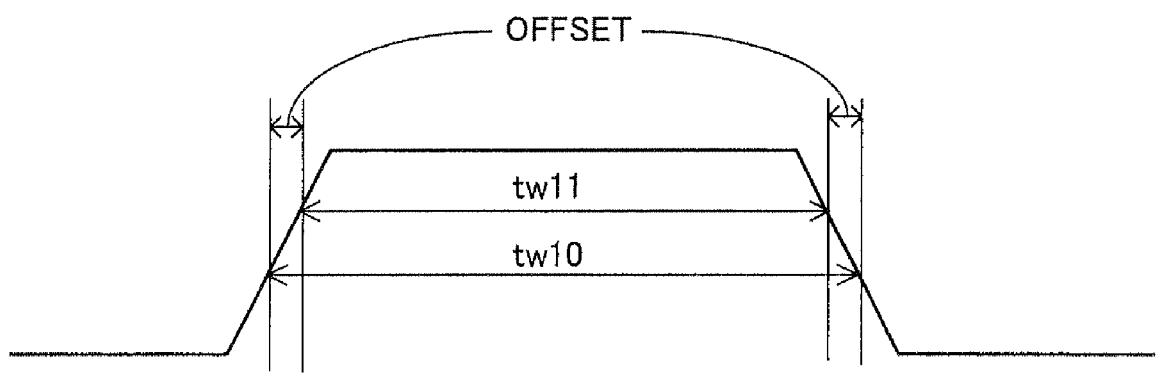
FIG. 9 shows a pulse width difference caused by a difference between thresholds.

With the AD converting device 20 described above, digital values corresponding to analog information from −TF to +TF can be represented by means of a single full-scale time TF. Namely, twice as much information can be handled per full-scale time TF. Consequently, compared with the case where the time-domain signal is used in the conventional manner as shown in FIG. 6, the signal processing speed can be doubled without degrading the S/N ratio.

Further, by using the difference between the digital values converted from the pulse widths of the two time-domain signals S1 and S2, it is possible to cancel out not only the pulse width offset component attributable to the threshold difference shown in FIG. 3, but also the pulse width offset component arising from the skew in the converting device.

Moreover, external noise attributable, for example, to power supply fluctuation in the signal generating circuit 11 shown in FIG. 2 can also be canceled out by using the difference between the digital values converted from the pulse widths of the two time-domain signals S1 and S2, since such noise is applied to both time-domain signals.

The aforementioned circuit configuration of the AD converting device 20 is given by way of example only and is not particularly limited. In the foregoing description, for example, the pulse widths of the time-domain signals S1 and S2 are converted to digital values at the fall timings of the respective time-domain signals. The time-domain signals S1 and S2 may be input such that their fall timings are aligned instead, by suitably adding or removing inverters, and the pulse widths obtained based on the rise timings may be converted to digital values. Alternatively, the pulse widths may be obtained using both the rise and fall timings of the time-domain signals.

The foregoing is considered as illustrative only of the principles of the embodiment. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

According to the embodiment, information contained in a unit time for carrying one item of analog signal information is represented by the difference (positive or negative information) between the pulse widths of two time-domain signals within the unit time, whereby the individual offset components of the two time-domain signals are canceled out, enabling high-accuracy signal processing. Also, since the pulse width difference is treated distinctively as positive or negative information, twice as much information can be carried per unit time, making it possible to improve the signal processing speed.

The above and other objects, features and advantages of the present invention will become apparent from the following description when taken in conjunction with the accompanying drawings which illustrate preferred embodiments of the present invention by way of example.

What is claimed is:

1. An analog/digital converting device converting a time-domain signal to a digital value, comprising:
    a digital converter for receiving first and second time-domain signals, converting a first pulse width of the first time-domain signal within a unit time for carrying one item of analog signal information, into a first digital value, and converting a second pulse width of the second time-domain signal within the unit time into a second digital value; and
    a subtracter for subtracting the second digital value from the first digital value and treating a result of the subtraction as a digital value contained in the unit time,
    wherein the digital converter includes:
        a first latch for capturing initiation timing of a first pulse of the first time-domain signal or of a second pulse of the second time-domain signal within the unit time,
        a plurality of delay circuits connected in series, for transferring an output signal from the first latch,
        a plurality of second latches connected to respective nodes between the delay circuits, for holding states of the respective nodes at termination timing of the first pulse, and
        a plurality of third latches connected to the respective nodes, for holding states of the respective nodes at termination timing of the second pulse, and
    wherein the second latches output the first digital value, and the third latches output the second digital value, and
    wherein the plurality of delay circuits are shared by the plurality of second latches and the plurality of third latches.

2. The analog/digital converting device according to claim 1, wherein:
    the first latch captures, as the initiation timing, rise timing of the first or second time-domain signal,
    the second latches hold the states of the respective nodes by using, as the termination timing of the first pulse, fall timing of the first time-domain signal, and
    the third latches hold the states of the respective nodes by using, as the termination timing of the second pulse, fall timing of the second time-domain signal.

3. The analog/digital converting device according to claim 1, wherein:
    the first latch captures, as the initiation timing, fall timing of the first or second time-domain signal,
    the second latches hold the states of the respective nodes by using, as the termination timing of the first pulse, rise timing of the first time-domain signal, and
    the third latches hold the states of the respective nodes by using, as the termination timing of the second pulse, rise timing of the second time-domain signal.

* * * * *